United States Patent
Kim

(10) Patent No.: US 8,736,249 B2
(45) Date of Patent: May 27, 2014

(54) HIGH FREQUENCY POWER DETECTOR CIRCUIT AND RADIO COMMUNICATION DEVICE

(75) Inventor: Ryangsu Kim, Osaka (JP)

(73) Assignee: Panasonic Corporation, Osaka (JP)

( * ) Notice: Subject to any disclaimer, the term of this patent is extended or adjusted under 35 U.S.C. 154(b) by 470 days.

(21) Appl. No.: 13/238,808

(22) Filed: Sep. 21, 2011

(65) Prior Publication Data

US 2012/0007580 A1 Jan. 12, 2012

Related U.S. Application Data

(63) Continuation of application No. PCT/JP2009/004746, filed on Sep. 18, 2009.

(30) Foreign Application Priority Data

Apr. 23, 2009 (JP) ................................. 2009-105593

(51) Int. Cl.
| | |
|---|---|
| G01R 35/04 | (2006.01) |
| G01R 27/08 | (2006.01) |
| G01R 19/00 | (2006.01) |
| G01R 27/02 | (2006.01) |

(52) U.S. Cl.
CPC ............... *G01R 35/04* (2013.01); *G01R 27/02* (2013.01); *G01R 19/0092* (2013.01)
USPC .............................. 324/74; 324/713; 702/64

(58) Field of Classification Search
CPC ..................................................... G01R 35/04
USPC .................... 324/74, 98, 522, 713; 702/64, 57
See application file for complete search history.

(56) References Cited

U.S. PATENT DOCUMENTS

| | | | | |
|---|---|---|---|---|
| 5,789,928 A | * | 8/1998 | Baker | 324/623 |
| 8,405,382 B2 | * | 3/2013 | King | 324/142 |
| 2003/0020515 A1 | | 1/2003 | Aoki et al. | |
| 2011/0313700 A1 | * | 12/2011 | Kouno et al. | 702/64 |

FOREIGN PATENT DOCUMENTS

| | | |
|---|---|---|
| JP | 2002-314341 | 10/2002 |
| JP | 2003-125012 | 4/2003 |
| JP | 2005-142955 | 6/2005 |
| WO | WO 2004/040795 A2 | 5/2004 |

OTHER PUBLICATIONS

S.L. Wong et al., "A 2.7-5.5 V, 0.2-1 W BiCMOS RF Driver Amplifier IC with Closed-Loop Power Control and Biasing Functions," IEEE Journal of Solid State Circuits, vol. 33, No. 12, Dec. 1998, pp. 2259-2264.

\* cited by examiner

*Primary Examiner* — Hoai-An D Nguyen
(74) *Attorney, Agent, or Firm* — McDermott Will & Emery LLP

(57) ABSTRACT

A first envelope detector circuit and a second envelope detector circuit are the same in circuit configuration, where the former detects an input high frequency signal, and the latter generates a reference voltage for power level detection. A detector detects an output voltage of a selector configured to select an output of the first envelope detector circuit with reference to an output voltage of a selector configured to select an output of the second envelope detector circuit. A controller controls an input selector to determine and store control values for the two selectors during input of a high frequency reference signal generated by a high frequency reference signal generating unit, and controls the two selectors by using the stored control values when an actual high frequency signal is input.

30 Claims, 5 Drawing Sheets

HIGH FREQUENCY POWER DETECTOR CIRCUIT AND RADIO COMMUNICATION DEVICE

CROSS-REFERENCE TO RELATED APPLICATION

This is a continuation of PCT International Application PCT/JP2009/004746 filed on Sep. 18, 2009, which claims priority to Japanese Patent Application No. 2009-105593 filed on Apr. 23, 2009. The disclosures of these applications including the specifications, the drawings, and the claims are hereby incorporated by reference in their entirety.

BACKGROUND

The present invention relates to a detector circuit for detecting high frequency signal power. In particular, it relates to a high frequency power detector circuit useful for automatic gain control and automatic power level control in radio communication devices.

In recent years, cellular phone terminals have been provided with various radio communication functions such as digital television, FM radio, Bluetooth® and wireless LAN in addition to a telephone function. In order to meet increasing demand for reduction in size and cost of radio communication terminals and modules included in them, integration of high performance circuit systems, which have not been integrated so far, has been proceeding on a radio communication chip. A high frequency signal power detector circuit (a high frequency power detector circuit) is an example of the high performance circuit systems.

In radio communication devices, a high frequency power detector circuit is used for automatic gain control in an amplifier and a mixer on a receiving system based on the intensity of a received signal input from an antenna, and for automatic gain control in a power amplifier on a transmission system by detecting an output signal level of the power amplifier. Such automatic control systems are incorporated in most of radio communication transmitters/receivers to achieve highly reliable radio communication.

In general, automatic gain control is performed based on the results of comparison between a reference signal generated in an integrated circuit (IC) and an output signal of an envelope detector circuit. Therefore, the precision of the control system depends on the precision of the internally generated reference signal and the output signal of the envelope detector circuit. For this reason, if reduction in supply voltage and increase in variation in the course of manufacture associated with the shrink of semiconductor design rules take place, signals received at an IC of a radio communication transmitter/receiver are distorted and a significant amount of noise is contained in the signal. As a result, radio communication quality is impaired.

The rapidly spreading digital terrestrial television broadcasting for mobile units (ISDB-T, so-called one segment broadcasting) is characterized in that a broadband radio communication band is used. In many cases, cellular phones are equipped with an IC for receiving the one segment broadcasting. Therefore, even if a high frequency filter is provided between the antenna and a tuner intended for the one segment broadcasting, various kinds of interference waves in and out of the band are input into the tuner through the antenna or by inner radiation. For improved communication quality, it is necessary to dynamically switch the power detection level based on a received channel or a radio wave condition. This brings about a need of realizing an inexpensive high frequency power detector circuit having higher precision as compared with conventional ones, while a semiconductor process under finer design rules is employed, though which results in significant variations in the course of manufacture. Further, in view of reduced product life cycle, an easy-to-design detector circuit which eliminates the need of adjustment of variations in the course of manufacture before shipment as much as possible has been demanded.

In many cases, an envelope detector circuit mainly consisting of a transistor, a current source and a capacitance is used in a conventional high frequency power detector circuit (see, for example, Stephen L. Wong and Sifen Luo, "A 2.7-5.5 V, 0.2-1 W BiCMOS RF Driver Amplifier IC with Closed-Loop Power Control and Biasing Functions," IEEE JOURNAL OF SOLID STATE CIRCUITS, VOL. 33, NO. 12, DECEMBER 1998, pp. 2259-2264). Further, for reduction of detection error, a high frequency power detector circuit in which a DC reference voltage is converted to an AC (square wave) reference voltage has been proposed (see, for example, International Patent Publication No. WO/2004/040795).

FIG. 5 shows the structure of a conventional high frequency power detector circuit. An input high frequency signal is input to a base of a transistor 21 of an envelope detector circuit 2 after the center level of the input high frequency signal is shifted by a level shifter 1. In the envelope detector circuit 2, a collector of the transistor 21 is connected to a supply voltage node. A current source 22 and a capacitive element 23 are connected in parallel between an emitter and a ground node. When a capacitance value of the capacitive element 23 is increased to a sufficient degree, an envelope of the high frequency signal input to the base of the transistor 21 is extracted from the emitter.

In the same manner as the envelope detector circuit 2, an envelope detector circuit 3 includes a transistor 31 and a current source 32 and a capacitive element 33 connected in parallel to an emitter of the transistor 31. A reference voltage generated in a reference voltage generating circuit 4 is applied to a base of the transistor 31, and a reference signal is output from the emitter. A low-pass filter 5 outputs the results of high frequency signal power detection based on a difference between the outputs from the envelope detector circuits 2 and 3. The reference voltage generating circuit 4 is configured to generate a reference voltage corresponding to a power to be detected by changing a DC reference voltage Vref so that multiple levels of power are detected. In this way, a high frequency power detector circuit is constructed by the envelope detector circuit 2 and its replica (envelope detector circuit 3) with the aim of reducing variations in detected output due to temperature, supply voltage and variations in threshold value of the transistor in the course of manufacture.

SUMMARY

According to a conventional high frequency power detector circuit, a current source and a resistance row are essential to generate the reference voltage. Therefore, absolute values of a current and resistance vary due to variations in the course of manufacture, change in temperature and change in supply voltage, thereby causing an error in detected power level. In general, current mirror circuits are used as current sources in an envelope detector circuit and its replica. However, an error in detected power level may occur due to an error in input reference current and a mismatch between threshold values of paired transistors in the current mirror circuit. Further, since the conventional high frequency power detector circuit requires a reference voltage generating circuit in addition to the two envelope detector circuits, the circuit dimension is increased.

To solve the above problems, configurations as described below is effective. For example, a high frequency power detector circuit includes: a level shifter configured to shift a center level of an input high frequency signal to a predetermined voltage; first and second envelope detector circuits each having a resistance row, a capacitive element connected to the resistance row in parallel, and a transistor connected between a connection point between the resistance row and the capacitive element and a predetermined voltage node; a selector configured to select any one of a plurality of intermediate terminal voltages of the resistance row of the first envelope detector circuit; and a detector configured to detect an output voltage of the selector with reference to a total voltage or an intermediate terminal voltage of the resistance row of the second envelope detector circuit, wherein an output of the level shifter is supplied to a gate or a base of the transistor of the first envelope detector circuit, and the predetermined voltage is supplied to a gate or a base of the transistor of the second envelope detector circuit.

A high frequency power detector circuit includes: the above level shifter; the above first and second envelope detector circuits; a selector configured to select any one of a total voltage and a plurality of intermediate terminal voltages of the resistance row of the second envelope detector circuit; and a detector configured to detect an intermediate terminal voltage of the resistance row of the first envelope detector circuit with reference to an output voltage of the selector, wherein an output of the level shifter is supplied to a gate or a base of the transistor of the first envelope detector circuit, and the predetermined voltage is supplied to a gate or a base of the transistor of the second envelope detector circuit.

A high frequency power detector circuit includes: the above level shifter; the above first and second envelope detector circuits; a variable gain amplifier configured to amplify an intermediate terminal voltage of the resistance row of the first envelope detector circuit; and a detector configured to detect an output voltage of the variable gain amplifier with reference to a total voltage or an intermediate terminal voltage of the resistance row of the second envelope detector circuit, wherein an output of the level shifter is supplied to a gate or a base of the transistor of the first envelope detector circuit, and the predetermined voltage is supplied to a gate or a base of the transistor of the second envelope detector circuit.

A high frequency power detector circuit includes: the above level shifter; the above first and second envelope detector circuits; a variable gain amplifier configured to amplify a total voltage or an intermediate terminal voltage of the resistance row of the second envelope detector circuit; and a detector configured to detect an intermediate terminal voltage of the resistance row of the first envelope detector circuit with reference to an output voltage of the variable gain amplifier, wherein an output of the level shifter is supplied to a gate or a base of the transistor of the first envelope detector circuit, and the predetermined voltage is supplied to a gate or a base of the transistor of the second envelope detector circuit.

A high frequency power detector circuit includes: a variable gain amplifier configured to amplify an input high frequency signal; a level shifter configured to shift a center level of an output of the variable gain amplifier to a predetermined voltage; the first and second envelope detector circuits; and a detector configured to detect an intermediate terminal voltage of the resistance row of the first envelope detector circuit with reference to a total voltage or an intermediate terminal voltage of the resistance row of the second envelope detector circuit, wherein an output of the level shifter is supplied to a gate or a base of the transistor of the first envelope detector circuit, and the predetermined voltage is supplied to a gate or a base of the transistor of the second envelope detector circuit.

According to the configurations, an envelope of the high frequency signal is detected by the first envelope detector circuit, a reference voltage for power level detection is generated by the second envelope detector circuit of the same structure as the first envelope detector circuit, and an output of the first envelope detector circuit (an output of the selector or the variable gain amplifier, depending on the configuration) is detected by the detector with reference to an output of the second envelope detector circuit (an output of the selector or the variable gain amplifier, depending on the configuration). As a result, the power level of the input high frequency signal is detected. The first and second envelope detector circuits may be provided without using a current source. Further, there is no need of additionally providing a reference voltage generating circuit. Accordingly, the total number of resistive elements is kept small. Moreover, when the selector or the variable gain amplifier is accordingly controlled, it is possible to perform calibration and to detect multiple levels of power in a time-sharing manner. Therefore, as compared with conventional ones, the high frequency power detector circuit is improved in resistance against variations in the course of manufacture, change in temperature and change in supply voltage, thereby raising precision of high frequency power detection, and is reduced in size.

Preferably, the high frequency power detector circuit includes: a high frequency reference signal generating unit configured to generate a high frequency reference signal; an input selector configured to select either one of an actual high frequency signal or the high frequency reference signal, and input the selected signal to the level shifter; and a controller configured to control the input selector and the selector (the variable gain amplifier, depending on the configuration). The controller sequentially changes an output of the selector (a gain of the variable gain amplifier, depending on the configuration), during input of the high frequency reference signal to the level shifter, to store a control value for the selector (the variable gain amplifier, depending on the configuration) of the time when an output of the detector is inverted, and controls the selector (the variable gain amplifier, depending on the configuration) by using the stored control value when the actual high frequency signal is input to the level shifter. Specifically, the high frequency reference signal generating unit includes a local signal generator, an amplifier configured to clip an output of the local signal generator at an amplitude proportional to a power supply voltage, and an attenuator configured to attenuate an output of the amplifier. More specifically, the amplifier includes cascade-connected inverter circuits. With this configuration, calibrating the high frequency power detector circuit enables highly precise high-frequency power detection with small variations.

Moreover, the high frequency power detector circuit preferably includes a controller configured to cyclically change an output of the selector (the gain of the variable gain amplifier, depending on the configuration). With this configuration, multiple levels of power can be detected in a time-sharing manner.

DETAILED DESCRIPTION

First Embodiment

Figure 1:
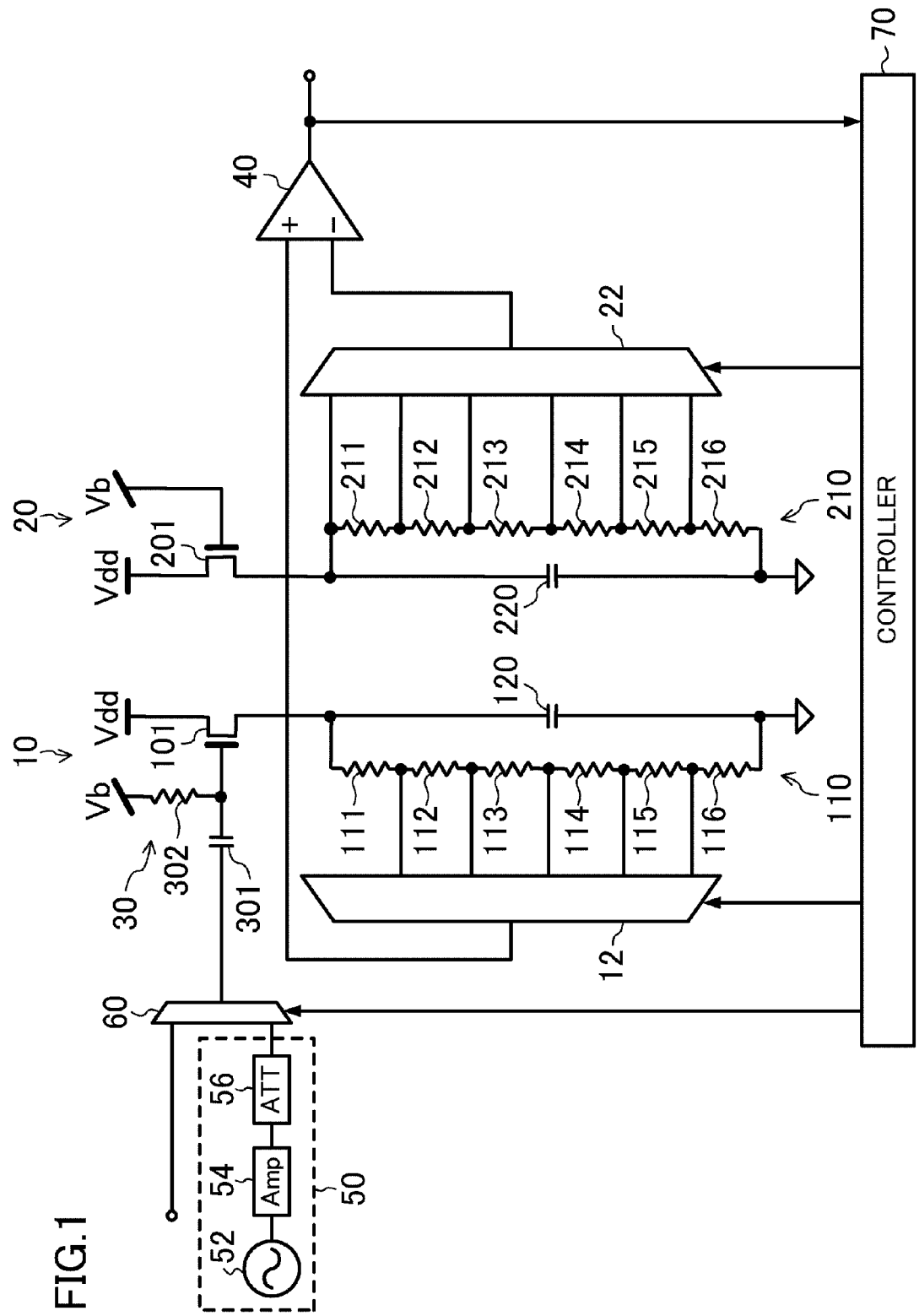
FIG. 1 shows the structure of a high frequency power detector circuit according to a first embodiment.

FIG. 1 shows the structure of a high frequency power detector circuit according to a first embodiment. In the envelope detector circuit 10, a drain of an N-channel field effect transistor 101 is connected to a supply voltage Vdd, and a resistance row 110 including six serially-connected resistive elements 111, 112, 113, 114, 115, and 116 and a capacitative element 120 are connected to a source of the transistor 101 in parallel. The structure of another envelope detector circuit 20 is the same as that of the envelope detector circuit 10. That is, in the envelope detector circuit 20, a drain of an N-channel field effect transistor 201 is connected to a supply voltage Vdd, and a resistance row 210 including six serially-connected resistive elements 211, 212, 213, 214, 215, and 216 and a capacitative element 220 are connected to a source of the transistor 201 in parallel. In the envelope detector circuits 10 and 20, corresponding elements have the same characteristic value. For example, the capacitative elements 120 and 220 have the same capacitance.

A level shifter 30 is configured to shift a center level of an input high frequency signal to a predetermined voltage. More specifically, the level shifter 30 cuts a DC component of the high frequency signal at a capacitative element 301 and applies, in place of it, a bias voltage Vb through a resistive element 302. The bias voltage Vb is a DC reference voltage which determines an absolute value of a power level. Therefore, it is preferred that the bias voltage Vb be less likely to vary due to variations in the course of manufacture, change in temperature and change in supply voltage.

An output of the level shifter 30 is input to a gate of the transistor 101 of the envelope detector circuit 10. The transistor 101 rectifies a signal input to the gate so that the capacitative element 120 is charged. According to this action, a source voltage of the transistor 101 becomes a value corresponding to an amplitude of the high frequency signal. When a time constant determined by the product of a total resistance of the resistance row 110 and a capacitance of the capacitative element 120 is sufficiently greater than a single period of the input high frequency signal, the source voltage of the transistor 101 becomes a value corresponding to an envelope of the high frequency signal.

To a gate of the transistor 201 of the envelope detector circuit 20, a bias voltage Vb corresponding to the center level of the high frequency signal is applied. Since the envelope detector circuit 20 is a replica of the envelope detector circuit 10, a source voltage of the transistor 201 corresponds to the source voltage of the transistor 101 when the high frequency signal is not input. Therefore, using the source voltage of the transistor 201 as a reference voltage, the reference voltage and a detection signal of the envelope detector circuit 10 are compared, so that a power level of the input high frequency signal is detected. The capacitative element 220 serves to eliminate noise contained in the supply voltage Vdd.

When the high frequency signal is input, however, the source voltage of the transistor 101 is inevitably higher than the source voltage of the transistor 201. Therefore, the power level of the high frequency signal cannot be detected by simply comparing the source voltages. In view of this, an intermediate terminal voltage of the resistance row 110 in the envelope detector circuit 10 is considered as an object to be detected. The intermediate terminal voltage of the resistance row 110 can be made smaller than the source voltage of the transistor 201 by setting the resistance ratio between the resistive elements 111-116 to a suitable value.

Figure 5:
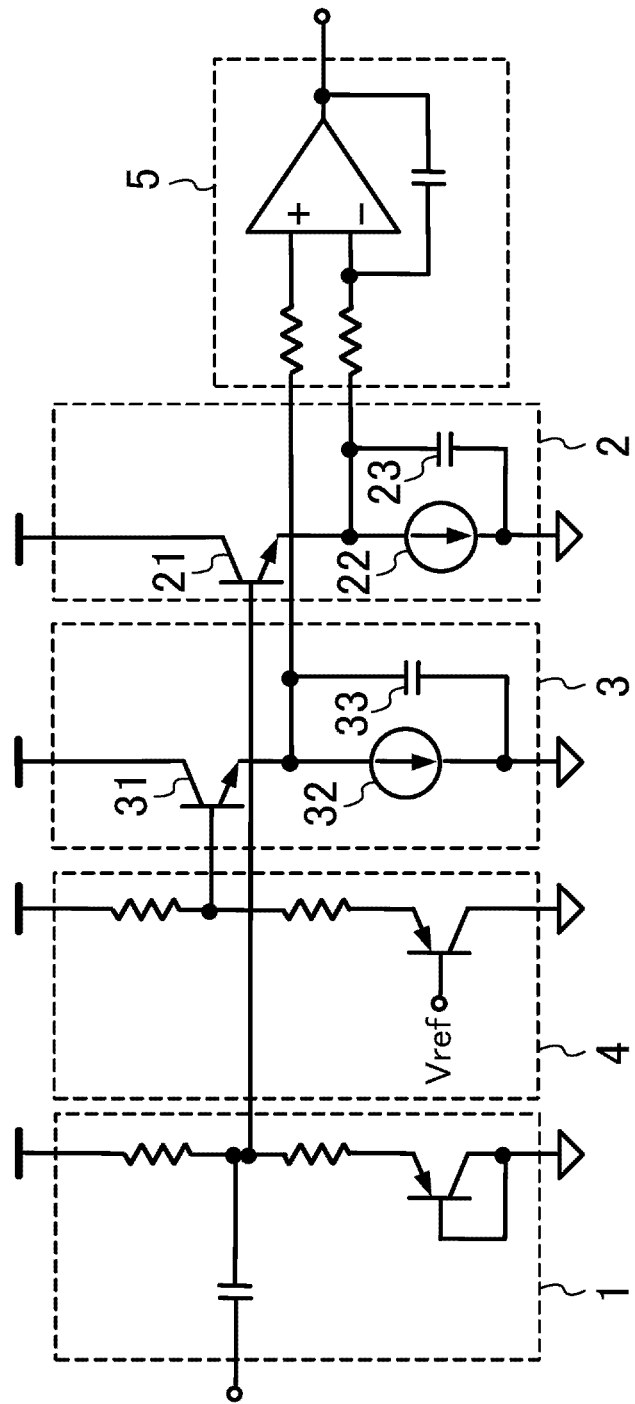
FIG. 5 shows the structure of a conventional high frequency power detector circuit.

A selector 12 selects any one of intermediate terminal voltages which are voltages at connection points of the resistive elements 111-116 of the envelope detector circuit 10. A selector 22 selects the source voltage of the transistor 201 of the envelope detector circuit 20, that is, any one of a total voltage of the resistance row 210 and intermediate terminal voltages which are voltages at connection points of the resistive elements 211-216. A detector 40 detects an output voltage of the selector 12 with reference to an output voltage of the selector 22. More specifically, the detector 40 may be a comparator. From the comparison results, the power level of the input high frequency signal is obtained. The low-pass filter or an A/D converter shown in FIG. 5 may also be used as the detector 40.

A high frequency reference signal generating unit 50 generates a high frequency reference signal which will be a reference of an actual high frequency signal input to the high frequency power detector circuit. An input selector 60 selects either one of the actual high frequency signal or the high frequency reference signal, and inputs the selected signal to the level shifter 30.

A controller 70 controls the selector 12, the selector 22, and the input selector 60 to calibrate the high frequency power detector circuit. Specifically, the controller 70 instructs the input selector 60 to select the high frequency reference signal so that the high frequency reference signal is input to the level shifter 30, and sequentially changes an output of at least one of the selector 12 or the selector 22. The controller 70 stores control values for the selector 12 and the selector 22 of the time when an output of the detector 40 is inverted. When the controller 70 instructs the input selector 60 to select the actual high frequency signal so that the actual high frequency signal is input to the level shifter 30, the controller 70 controls the selector 12 and the selector 22 by using the control values stored earlier.

The high frequency reference signal is a reference signal for the calibration, and thus is preferably less susceptible to the influence of variations in the course of manufacture or change in temperature. Thus, for example, an output of a local signal generator 52 is clipped by an amplifier 54 at an amplitude proportional to the power supply voltage, and is also attenuated by an attenuator 56, thereby generating the high frequency reference signal. A recent-year semiconductor integrated circuit generates a highly accurate power supply voltage with small variations therein. Thus, clipping the output of the local signal generator 52 at such a power supply voltage can generate a high frequency reference signal less susceptible to the influence of variations in the course of manufacturing or change in temperature. Note that the local signal generator 52 may be, for example, an external PLL synthesizer.

The amplifier 54 may be made of one inverter circuit which operates with the power supply voltage generated in the semiconductor integrated circuit, or may include a cascode connection of a plurality of such inverter circuits. As the number of stages of the cascade connection increases, an output of the final stage approximates a rectangular wave form. The output voltage Vout of the final stage is given by the following equation.

$$Vout(\omega t) = \frac{2Vdd}{\pi} \sum_{n=1}^{\infty} \frac{\sin(2n-1)\omega t}{2n-1} \quad \text{[Equation 1]}$$

where Vdd is a power supply voltage, n is an integer greater than or equal to 1, and ω is the angular frequency of an input signal.

The signal amplitude of a fundamental wave (ω) is three times as high as that of a third harmonic wave (3ω), that is, the signal amplitude of the fundamental wave (ω) is higher than that of the third harmonic wave (3ω) by 9.5 dB. Thus, when a high frequency reference signal of a substantially rectangular wave form is input to the envelope detector circuit 10, an output is substantially determined by the amplitude of the fundamental wave. Moreover, when the gain of the amplifier 54 is sufficiently large, it is possible to generate a high frequency reference signal having a constant amplitude with small variations even when the output of the local signal generator 52 is small.

The controller 70 may perform time-sharing control on the high frequency power detector circuit by controlling at least one of the selector 12 or the selector 22. That is, the controller 70 cyclically changes the output of at least one of the selector 12 or the selector 22. For example, the total voltage of the resistance row 210 is used as a first reference voltage, an intermediate terminal voltage at a connection point of the resistive element 212 and the resistive element 213 is used as a second reference voltage, and these two reference voltages are alternately output from the selector 22, so that two levels of power can be detected in a time-sharing manner. Of course, when the number of reference voltages output from the selector 22 is increased, more levels of power can be detected in a time-sharing manner.

The calibration and the time-sharing control may be combined. In this case, the calibration is preferably performed by using high frequency reference signals respectively corresponding to levels of power to be detected. Thus, multiple ones of the high frequency reference signal generating unit 50 which are configured to generate high frequency reference signals having power levels different from each other may be provided, or the attenuation value of the attenuator 56 of the high frequency reference signal generating unit 50 may be variable to generate high frequency reference signals having various levels of power.

Note that either one of the selector 12 or the selector 22 may be omitted. However, when both the selector 12 and the selector 22 are provided, finer calibration and time-sharing detection of more levels of power are possible.

Second Embodiment

Figure 2:
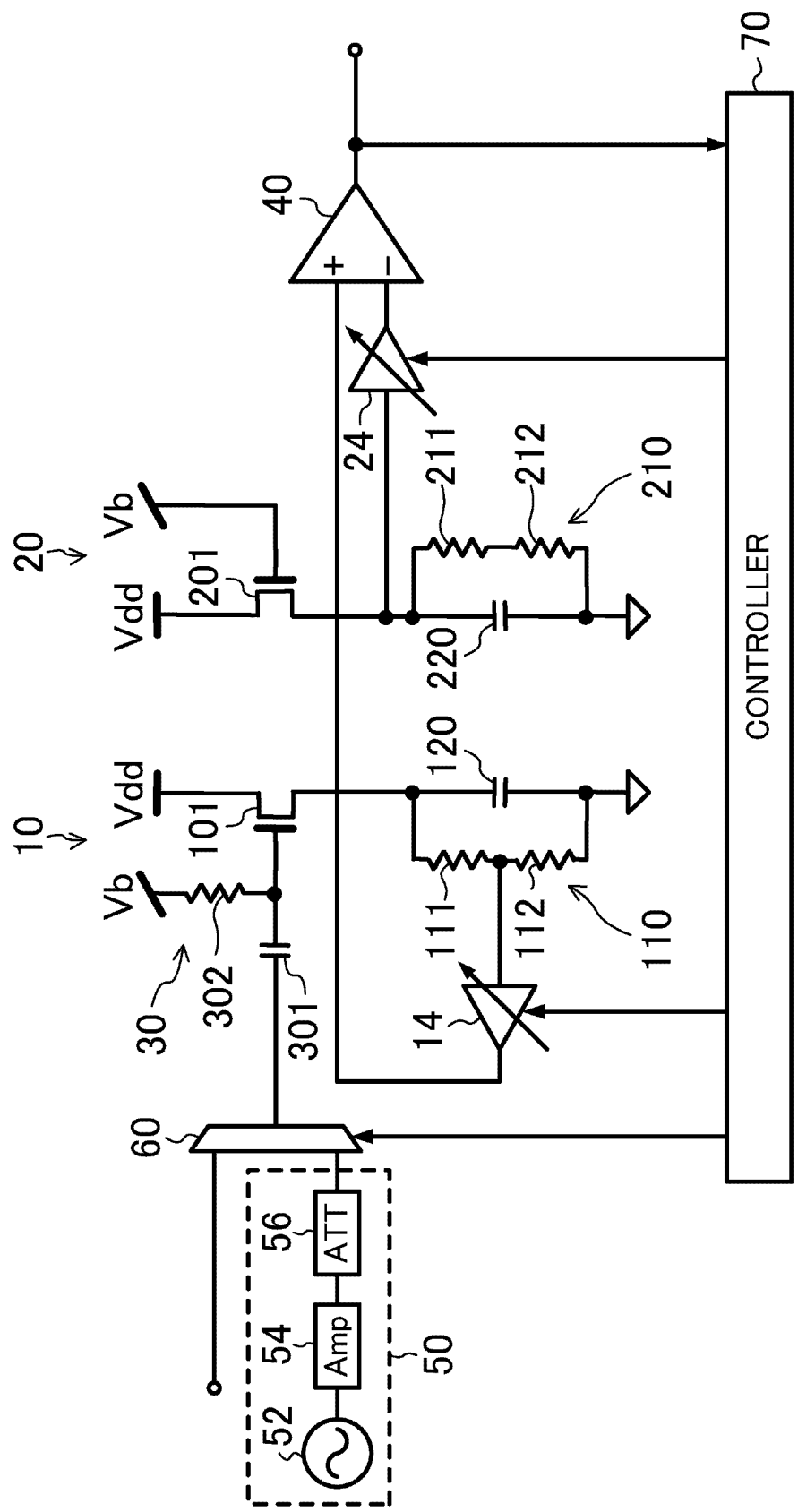
FIG. 2 shows the structure of a high frequency power detector circuit according to a second embodiment.

FIG. 2 shows the structure of a high frequency power detector circuit according to a second embodiment. The difference from the structure of the first embodiment is described below in detail. In the envelope detector circuit 10, a drain of an N-channel field effect transistor 101 is connected to a supply voltage Vdd, and a resistance row 110 including two serially-connected resistive elements 111 and 112 and a capacitative element 120 are connected to a source the transistor 101 in parallel. The structure of another envelope detector circuit 20 is the same as that of the envelope detector circuit 10. That is, in the envelope detector circuit 20, a drain of an N-channel field effect transistor 201 is connected to a supply voltage Vdd, and a resistance row 210 including two serially-connected resistive elements 211 and 212 and a capacitative element 220 are connected to a source of the transistor 201 in parallel. In the envelope detector circuits 10 and 20, corresponding elements have the same characteristic value. For example, the capacitative elements 120 and 220 have the same capacitance.

A variable gain amplifier 14 amplifies an intermediate terminal voltage of the resistance row 110 of the envelope detector circuit 10, i.e., a voltage at a connection point between the resistive elements 111 and 112. A variable gain amplifier 24 amplifies a source voltage of the transistor 201 of the envelope detector circuit 20, i.e., a total voltage of the resistance row 210. A detector 40 detects an output voltage of the variable gain amplifier 14 by using an output voltage of the variable gain amplifier 24.

A controller 70 controls the variable gain amplifier 14, the variable gain amplifier 24, and an input selector 60 to calibrate the high frequency power detector circuit. Specifically, the controller 70 instructs the input selector 60 to select a high frequency reference signal so that the high frequency reference signal is input to a level shifter 30, and sequentially changes the gain of at least one of the variable gain amplifier 14 or the variable gain amplifier 24. The controller 70 stores control values for the variable gain amplifier 14 and the variable gain amplifier 24 of the time when an output of the detector 40 is inverted. When the controller 70 instructs the input selector 60 to select an actual high frequency signal so that the actual high frequency signal is input to the level shifter 30, the controller 70 controls the variable gain amplifier 14 and the variable gain amplifier 24 by using the control values stored earlier.

The controller 70 may also perform time-sharing control on the high frequency power detector circuit by controlling at least one of the variable gain amplifier 14 or the variable gain amplifier 24. That is, the controller 70 cyclically changes the gain of at least one of the variable gain amplifier 14 or the variable gain amplifier 24. As described above, the calibration and the time-sharing control may be combined.

Each of the resistance rows 110 and 210 may include three or more resistive elements connected in series. In this case, the variable gain amplifier 24 may amplify an intermediate terminal voltage of the resistance row 210 in place of the source voltage of the transistor 201.

Alternatively, either one of the variable gain amplifier 14 or the variable gain amplifier 24 may be omitted. However, when both the variable gain amplifier 14 and the variable gain amplifier 24 are provided, finer calibration and time-sharing detection of more levels of power are possible. Alternatively, either one of the variable gain amplifier 14 or the variable gain amplifier 24 may be replaced with a selector.

Third Embodiment

Figure 3:
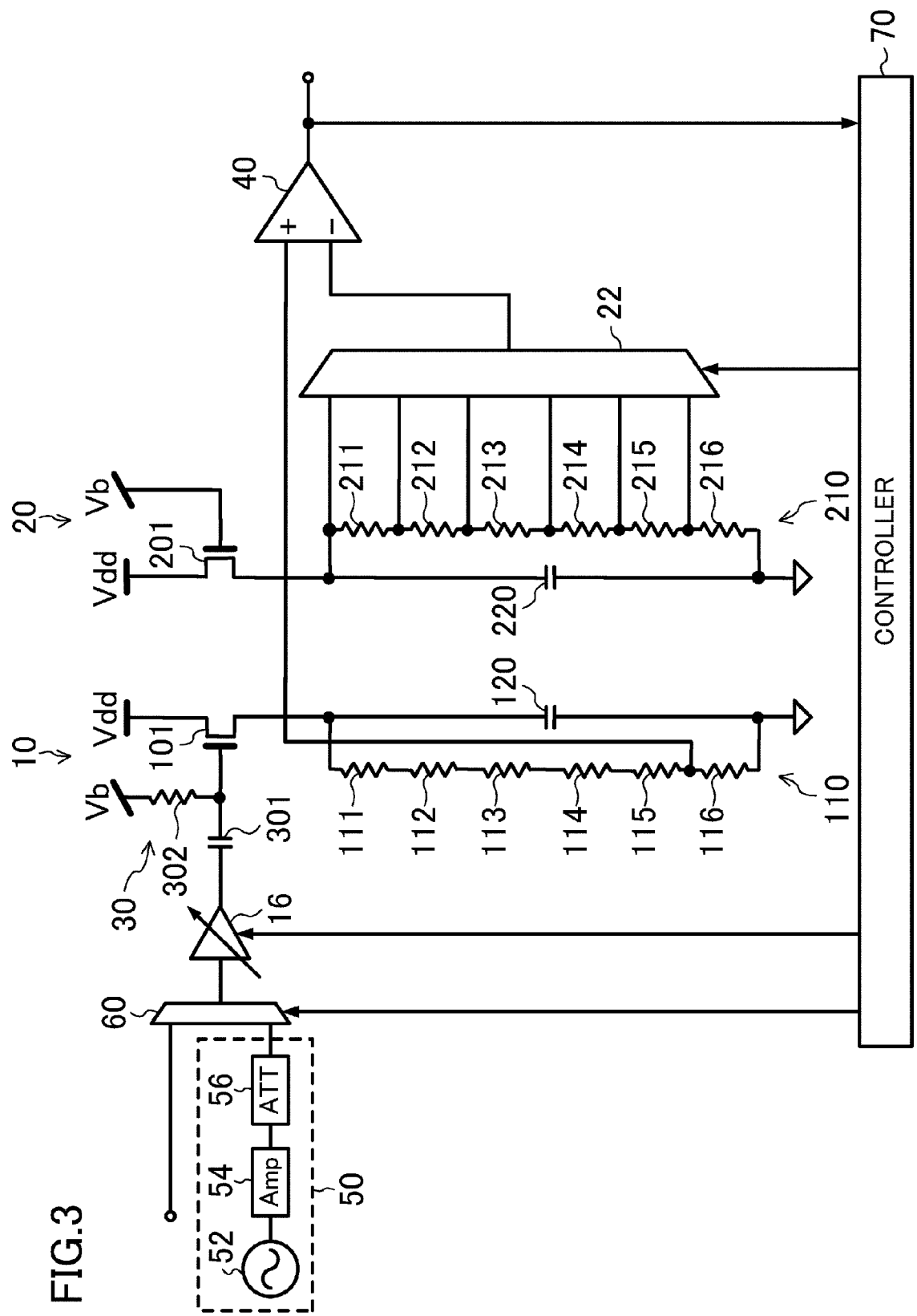
FIG. 3 shows the structure of a high frequency power detector circuit according to a third embodiment.

FIG. 3 shows the structure of a high frequency power detector circuit according to a third embodiment. The high frequency power detector circuit of the present embodiment is the high frequency power detector circuit of FIG. 1 in which the selector 12 is omitted, and a variable gain amplifier 16 is provided between the input selector 60 and the level shifter 30. The difference from the structure of the first embodiment is described below in detail.

The detector 40 detects an intermediate terminal voltage of the resistance row 110 of the envelope detector circuit 10 with reference to an output voltage of the selector 22. Although a voltage at a connection point of the resistive element 115 and the resistive element 116 is detected here, another intermediate terminal voltage may be detected.

The controller 70 controls the variable gain amplifier 16, the selector 22, and the input selector 60 to calibrate the high frequency power detector circuit. Specifically, the controller 70 instructs the input selector 60 to select a high frequency reference signal so that the high frequency reference signal is input to the variable gain amplifier 16, and sequentially changes at least one of the gain of the variable gain amplifier 16 or an output of the selector 22. The controller 70 stores control values for the variable gain amplifier 16 and the selector 22 of the time when an output of the detector 40 is inverted. When the controller 70 instructs the input selector 60 to select an actual high frequency signal so that the actual high frequency signal is input to the variable gain amplifier 16, the controller 70 controls the variable gain amplifier 16 and the selector 22 by using the control values stored earlier.

The controller 70 may also perform time-sharing control on the high frequency power detector circuit by controlling at least one of the variable gain amplifier 16 or the selector 22. That is, the controller 70 cyclically changes at least one of the gain of the variable gain amplifier 16 or the output of the selector 22. As described above, the calibration and the time-sharing control may be combined.

Note that the selector 22 may be omitted. However, when the selector 22 is provided, finer calibration and time-sharing detection of more levels of power are possible. Alternatively, the selector 22 may be replaced with a variable gain amplifier.

According to the embodiments, the envelope detector circuit is configured without using a current source, and the reference voltage is generated by the replica of the envelope detector circuit without providing an independent reference voltage generating circuit. Therefore, as compared with the conventional ones, the high frequency power detector circuit is improved in resistance against variations in the course of manufacture, change in temperature and change in supply voltage, thereby raising precision of high frequency power detection, and is reduced in size. Moreover, performing the calibration can further raising the precision of the high-frequency power detection. Furthermore, multiple levels of power can be detected by performing the time-sharing control.

In each of the embodiments, the transistors 101 and 102 may consist of P-channel field effect transistors, respectively. In this case, the resistance rows 110 and 210 and the capacitative elements 120 and 220 are connected to the supply voltage. As the transistors 101 and 102, other kinds of transistors such as bipolar transistors may be used. Further, the resistive elements and the capacitative elements of the high frequency power detector circuit may be realized by transistors.

Embodiment of Radio Communication Device

Figure 4:
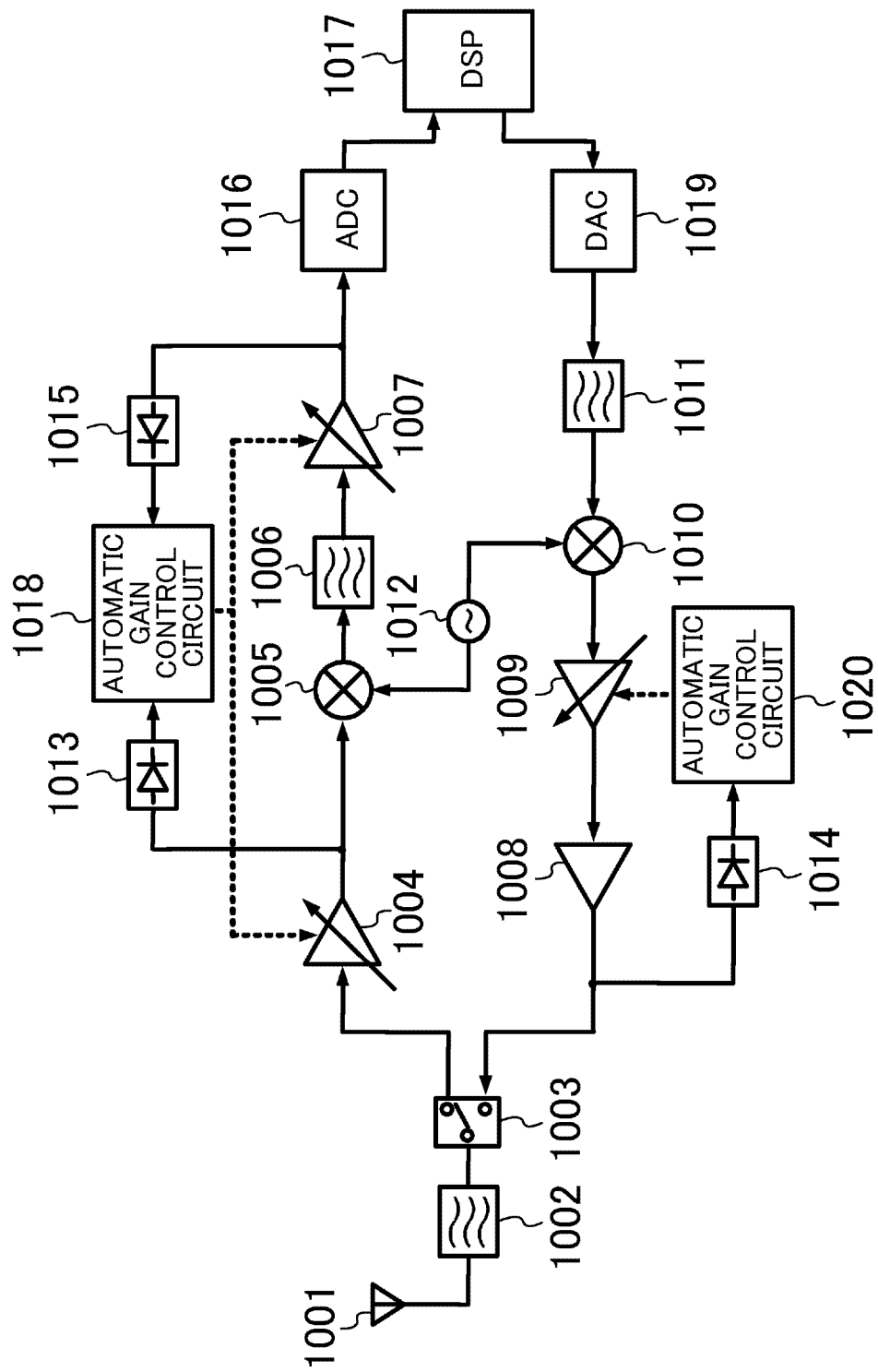
FIG. 4 shows the structure of a radio communication device.

FIG. 4 shows an embodiment of a radio communication device including a high frequency power detector circuit according to any one of the first to third embodiments. In a receiving system of the radio communication device of the present embodiment, a high frequency signal received by an antenna 1001 is input to a variable gain low-noise amplifier 1004 through a high frequency filter 1002 and a transmit-receive switch 1003. The received signal amplified by the low-noise amplifier 1004 is supplied to a high frequency power detector circuit 1013 and a mixer 1005. The mixer 1005 mixes an output of the low-noise amplifier 1004 and a local signal output from a local signal generator 1012 to down-convert the received signal to a baseband frequency signal. An output of the mixer 1005 is supplied to a variable gain baseband amplifier 1007 through a baseband filter 1006. The received signal amplified by the baseband amplifier 1007 is then supplied to an A/D converter 1016 and a baseband power detector circuit 1015.

The A/D converter 1016 converts the received signal input thereto into a digital signal. A digital signal processor 1017 processes the digital output of the A/D converter 1016. The high frequency power detector circuit 1013 and the baseband power detector circuit 1015 detect the output power level of each of the low-noise amplifier 1004 and the baseband amplifier 1007. An automatic gain control circuit 1018 performs feedback control based on the detection results so that the values of the gains of the low-noise amplifier 1004 and the baseband amplifier 1007 become suitable for the output power levels. For example, when the power level of the input signal is increased from a minimum reception level, optimum control is performed to reduce the gain of the baseband amplifier 1007 and then reduce the gain of the low-noise amplifier 1004 so that the signal input to the A/D converter 1016 is not distorted. On the other hand, when the power level of the input signal is decreased from a maximum allowable level, optimum control is performed to increase the gain of the low-noise amplifier 1004 so that the received signal input to the A/D converter 1016 is not distorted and then increase the gain of the baseband amplifier 1007.

In a transmission system of the radio communication device of the present embodiment, a digital signal output from the digital signal processor 1017 is converted into an analog signal by a D/A converter 1019. The analog signal is supplied to a mixer 1010 through a baseband filter 1011. The mixer 1010 mixes the output signal of the baseband filter 1011 and a local signal output from the local signal generator 1012 to up-convert the transmission signal to a high frequency signal. The high frequency transmission signal is amplified by a variable gain driver amplifier 1009 and a power amplifier 1008 to a desired power level and supplied to a high frequency power detector circuit 1014 and the transmit-receive switch 1003. The high frequency transmission signal is then transmitted from the antenna 1001 through the transmit-receive switch 1003 and the high frequency filter 1002. The high frequency power detector circuit 1014 detects the output power level of the power amplifier 1008. An automatic gain control circuit 1020 performs feedback control based on the detection results so that the value of the gain of the power amplifier 1008 becomes suitable for the output power level.

A single high frequency power detector circuit may be used as the high frequency power detector circuits 1013 and 1014. Further, the receiving system and the transmission system of the radio communication device described above may be configured independently to provide a radio signal receiver and a radio signal transmitter.

What is claimed is:
1. A high frequency power detector circuit comprising:
a level shifter configured to shift a center level of an input high frequency signal to a predetermined voltage;
first and second envelope detector circuits each having a resistance row, a capacitative element connected to the resistance row in parallel, and a transistor connected between a connection point between the resistance row and the capacitative element and a predetermined voltage node;
a selector configured to select any one of a plurality of intermediate terminal voltages of the resistance row of the first envelope detector circuit; and
a detector configured to detect an output voltage of the selector with reference to a total voltage or an intermediate terminal voltage of the resistance row of the second envelope detector circuit, wherein an output of the level shifter is supplied to a gate or a base of the transistor of the first envelope detector circuit, and the predetermined voltage is supplied to a gate or a base of the transistor of the second envelope detector circuit.

2. The high frequency power detector circuit of claim 1, further comprising:
a controller configured to cyclically change an output of the selector.

3. A radio communication device comprising the high frequency power detector circuit of claim 1.

4. The high frequency power detector circuit of claim 1, further comprising:
a high frequency reference signal generating unit configured to generate a high frequency reference signal;
an input selector configured to select either one of an actual high frequency signal or the high frequency reference signal, and input the selected signal to the level shifter; and
a controller configured to control the input selector and the selector, wherein
the controller sequentially changes an output of the selector, during input of the high frequency reference signal to the level shifter, to store a control value for the selector of the time when an output of the detector is inverted, and controls the selector by using the stored control value when the actual high frequency signal is input to the level shifter.

5. The high frequency power detector circuit of claim 4, wherein
the high frequency reference signal generating unit includes
a local signal generator,
an amplifier configured to clip an output of the local signal generator at an amplitude proportional to a power supply voltage, and
an attenuator configured to attenuate an output of the amplifier.

6. The high frequency power detector circuit of claim 5, wherein
the amplifier includes cascade-connected inverter circuits.

7. A high frequency power detector circuit comprising:
a level shifter configured to shift a center level of an input high frequency signal to a predetermined voltage;
first and second envelope detector circuits each having a resistance row, a capacitive element connected to the resistance row in parallel, and a transistor connected between a connection point between the resistance row and the capacitive element and a predetermined voltage node;
a variable gain amplifier configured to amplify an intermediate terminal voltage of the resistance row of the first envelope detector circuit; and
a detector configured to detect an output voltage of the variable gain amplifier with reference to a total voltage or an intermediate terminal voltage of the resistance row of the second envelope detector circuit; wherein
an output of the level shifter is supplied to a gate or a base of the transistor of the first envelope detector circuit, and the predetermined voltage is supplied to a gate or a base of the transistor of the second envelope detector circuit.

8. The high frequency power detector circuit of claim 7, further comprising:
a controller configured to cyclically change a gain of the variable gain amplifier.

9. A radio communication device comprising the high frequency power detector circuit of claim 7.

10. The high frequency power detector circuit of claim 7, further comprising:
a high frequency reference signal generating unit configured to generate a high frequency reference signal;
an input selector configured to select either one of an actual high frequency signal or the high frequency reference signal, and input the selected signal to the level shifter; and
a controller configured to control the input selector and the variable gain amplifier, wherein
the controller sequentially changes a gain of the variable gain amplifier, during input of the high frequency reference signal to the level shifter, to store a control value for the variable gain amplifier of the time when an output of the detector is inverted, and controls the variable gain amplifier by using the stored control value when the actual high frequency signal is input to the level shifter.

11. The high frequency power detector circuit of claim 10, wherein
the high frequency reference signal generating unit includes
a local signal generator,
an amplifier configured to clip an output of the local signal generator at an amplitude proportional to a power supply voltage, and
an attenuator configured to attenuate an output of the amplifier.

12. The high frequency power detector circuit of claim 11, wherein
the amplifier includes cascade-connected inverter circuits.

13. A high frequency power detector circuit comprising:
a level shifter configured to shift a center level of an input high frequency signal to a predetermined voltage;
first and second envelope detector circuits each having a resistance row, a capacitive element connected to the resistance row in parallel, and a transistor connected between a connection point between the resistance row and the capacitive element and a predetermined voltage node;
a variable gain amplifier configured to amplify a total voltage or an intermediate terminal voltage of the resistance row of the second envelope detector circuit; and
a detector configured to detect an intermediate terminal voltage of the resistance row of the first envelope detector circuit with reference to an output voltage of the variable gain amplifier, wherein
an output of the level shifter is supplied to a gate or a base of the transistor of the first envelope detector circuit, and the predetermined voltage is supplied to a gate or a base of the transistor of the second envelope detector circuit.

14. The high frequency power detector circuit of claim 13, further comprising:
a controller configured to cyclically change a gain of the variable gain amplifier.

15. A radio communication device comprising the high frequency power detector circuit of claim 13.

16. The high frequency power detector circuit of claim 13, further comprising:
a high frequency reference signal generating unit configured to generate a high frequency reference signal;
an input selector configured to select either one of an actual high frequency signal or the high frequency reference signal, and input the selected signal to the level shifter; and
a controller configured to control the input selector and the variable gain amplifier, wherein the controller sequentially changes a gain of the variable gain amplifier, during input of the high frequency reference signal to the level shifter, to store a control value for the variable gain amplifier of the time when an output of the detector is inverted, and controls the variable gain amplifier by using the stored control value when the actual high frequency signal is input to the level shifter.

17. The high frequency power detector circuit of claim 16, wherein
the high frequency reference signal generating unit includes
a local signal generator,
an amplifier configured to clip an output of the local signal generator at an amplitude proportional to a power supply voltage, and
an attenuator configured to attenuate an output of the amplifier.

18. The high frequency power detector circuit of claim 17, wherein
the amplifier includes cascade-connected inverter circuits.

19. A high frequency power detector circuit comprising:
a variable gain amplifier configured to amplify an input high frequency signal;
a level shifter configured to shift a center level of an output of the variable gain amplifier to a predetermined voltage;
first and second envelope detector circuits each having a resistance row, a capacitive element connected to the resistance row in parallel, and a transistor connected between a connection point between the resistance row and the capacitive element and a predetermined voltage node; and
a detector configured to detect an intermediate terminal voltage of the resistance row of the first envelope detector circuit with reference to a total voltage or an intermediate terminal voltage of the resistance row of the second envelope detector circuit; wherein
an output of the level shifter is supplied to a gate or a base of the transistor of the first envelope detector circuit, and
the predetermined voltage is supplied to a gate or a base of the transistor of the second envelope detector circuit.

20. The high frequency power detector circuit of claim 19, further comprising:
a controller configured to cyclically change a gain of the variable gain amplifier.

21. A radio communication device comprising the high frequency power detector circuit of claim 19.

22. The high frequency power detector circuit of claim 19, further comprising:
a high frequency reference signal generating unit configured to generate a high frequency reference signal;
an input selector configured to select either one of an actual high frequency signal or the high frequency reference signal, and input the selected signal to the variable gain amplifier; and
a controller configured to control the input selector and the variable gain amplifier, wherein
the controller sequentially changes a gain of the variable gain amplifier, during input of the high frequency reference signal to the variable gain amplifier, to store a control value for the variable gain amplifier of the time when an output of the detector is inverted, and controls the variable gain amplifier by using the stored control value when the actual high frequency signal is input to the variable gain amplifier.

23. The high frequency power detector circuit of claim 22, wherein
the high frequency reference signal generating unit includes
a local signal generator,
an amplifier configured to clip an output of the local signal generator at an amplitude proportional to a power supply voltage, and
an attenuator configured to attenuate an output of the amplifier.

24. The high frequency power detector circuit of claim 23, wherein
the amplifier includes cascade-connected inverter circuits.

25. A high frequency power detector circuit comprising:
a level shifter configured to shift a center level of an input high frequency signal to a predetermined voltage;
first and second envelope detector circuits each having a resistance row, a capacitive element connected to the resistance row in parallel, and a transistor connected between a connection point between the resistance row and the capacitive element and a predetermined voltage node;
a selector configured to select any one of a total voltage and a plurality of intermediate terminal voltages of the resistance row of the second envelope detector circuit;
a detector configured to detect an intermediate terminal voltage of the resistance row of the first envelope detector circuit with reference to an output voltage of the selector;
a high frequency reference signal generating unit configured to generate a high frequency reference signal;
an input selector configured to select either one of an actual high frequency signal or the high frequency reference signal and inputting the selected signal to the level shifter; and
a controller configured to control the input selector and the selector, wherein
an output of the level shifter is supplied to a gate or a base of the transistor of the first envelope detector circuit, and
the predetermined voltage is supplied to a gate or a base of the transistor of the second envelope detector circuit, and
the controller sequentially changes an output of the selector, during input of the high frequency reference signal to the level shifter, to store a control value for the selector of the time when an output to of the detector is inverted, and controls the selector by using the stored control value when the actual high frequency signal is input to the level shifter.

26. A radio communication device comprising the high frequency power detector circuit of claim 25.

27. The high frequency power detector circuit of claim 25, wherein
the high frequency reference signal generating unit includes
a local signal generator,
an amplifier configured to clip an output of the local signal generator at an amplitude proportional to a power supply voltage, and
an attenuator configured to attenuate an output of the amplifier.

28. The high frequency power detector circuit of claim 27, wherein
the amplifier includes cascade-connected inverter circuits.

29. A high frequency power detector circuit comprising:
a level shifter configured to shift a center level of an input high frequency signal to a predetermined voltage;
first and second envelope detector circuits each having a resistance row, a capacitive element connected to the resistance row in parallel, and a transistor connected between a connection point between the resistance row and the capacitative element and a predetermined voltage node;

a selector configured to select any one of a total voltage and a plurality of intermediate terminal voltages of the resistance row of the second envelope detector circuit;

a detector configured to detect an intermediate terminal voltage of the resistance row of the first envelope detector circuit with reference to an output voltage of the selector; and a controller configured to cyclically change an output of the selector, wherein an output of the level shifter is supplied to a gate or a base of the transistor of the first envelope detector circuit, and the predetermined voltage is supplied to a gate or a base of the transistor of the second envelope detector circuit.

30. A radio communication device comprising the high frequency power detector circuit of claim 29.

* * * * *